(12) United States Patent
Jang et al.

(10) Patent No.: US 11,862,589 B2
(45) Date of Patent: Jan. 2, 2024

(54) WAFER-LEVEL PACKAGE INCLUDING UNDER BUMP METAL LAYER

(71) Applicant: Samsung Electronics Co., Ltd., Suwon-si (KR)

(72) Inventors: Hyung Sun Jang, Hwasung-si (KR); Yeo Hoon Yoon, Hwasung-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 191 days.

(21) Appl. No.: 17/385,586

(22) Filed: Jul. 26, 2021

(65) Prior Publication Data
US 2021/0358874 A1    Nov. 18, 2021

Related U.S. Application Data

(63) Continuation of application No. 16/408,727, filed on May 10, 2019, now Pat. No. 11,107,783.

(30) Foreign Application Priority Data

Nov. 15, 2018 (KR) .................. 10-2018-0140467

(51) Int. Cl.
*H01L 23/00* (2006.01)

(52) U.S. Cl.
CPC ............ *H01L 24/05* (2013.01); *H01L 24/03* (2013.01); *H01L 24/11* (2013.01); *H01L 24/13* (2013.01); *H01L 24/16* (2013.01); *H01L 2224/02379* (2013.01); *H01L 2224/03462* (2013.01); *H01L 2224/03464* (2013.01); *H01L 2224/03828* (2013.01); *H01L 2224/03829* (2013.01); *H01L 2224/0401* (2013.01); *H01L 2224/05541* (2013.01); *H01L 2224/05547* (2013.01); *H01L 2224/05559* (2013.01); *H01L 2224/05573* (2013.01); *H01L 2224/05582* (2013.01); *H01L 2224/05611* (2013.01); *H01L 2224/05639* (2013.01); *H01L 2224/11334* (2013.01);
(Continued)

(58) Field of Classification Search
CPC ...................................................... H01L 24/05
See application file for complete search history.

(56) References Cited

U.S. PATENT DOCUMENTS 6,617,696 B1    9/2003    Bendal
6,746,949 B2    6/2004    Bendal
(Continued)

FOREIGN PATENT DOCUMENTS

JP    2004172416 A  *  6/2004
JP    3692978 B2    *  9/2005
(Continued)

OTHER PUBLICATIONS

Clarivate Analytics translation of Matsuura. (Year: 2005).*
(Continued)

*Primary Examiner* — Christopher A Johnson
(74) *Attorney, Agent, or Firm* — Harness, Dickey & Pierce, P.L.C.

(57) ABSTRACT

A semiconductor package includes a semiconductor chip comprising a first surface and a second surface, a redistribution layer on the first surface of the semiconductor chip, an under bump metal (UBM) layer on the redistribution layer, and a solder bump on the UBM layer, and the solder bump covers both outer side surfaces of the UBM layer.

19 Claims, 16 Drawing Sheets

(52) U.S. Cl.
CPC .............. *H01L 2224/11849* (2013.01); *H01L 2224/13006* (2013.01); *H01L 2224/13111* (2013.01); *H01L 2224/13139* (2013.01); *H01L 2224/16225* (2013.01); *H01L 2924/3512* (2013.01)

(56) References Cited

U.S. PATENT DOCUMENTS

| | | | |
|---|---|---|---|
| 8,581,420 B2 | 11/2013 | Tsai et al. | |
| 9,082,832 B2 | 7/2015 | Lin et al. | |
| 9,111,949 B2 | 8/2015 | Yu et al. | |
| 9,773,746 B2 | 9/2017 | Tseng et al. | |
| 2003/0151141 A1* | 8/2003 | Matsuki | H05K 3/244 257/E23.068 |
| 2004/0040855 A1* | 3/2004 | Batinovich | H01L 24/11 205/183 |
| 2005/0258540 A1 | 11/2005 | Minda | |
| 2008/0050905 A1 | 2/2008 | Uchida et al. | |
| 2008/0136019 A1 | 6/2008 | Johnson et al. | |
| 2011/0193223 A1 | 8/2011 | Ozaki et al. | |
| 2013/0147033 A1 | 6/2013 | Chen et al. | |
| 2014/0054767 A1 | 2/2014 | Yoshida et al. | |
| 2016/0163663 A1 | 6/2016 | Kim et al. | |
| 2016/0204076 A1 | 7/2016 | Lin et al. | |
| 2016/0240500 A1 | 8/2016 | Huang | |
| 2018/0068963 A1 | 3/2018 | Wu et al. | |
| 2018/0090444 A1* | 3/2018 | Lee | H01L 24/20 |
| 2018/0166618 A1 | 6/2018 | Kim et al. | |
| 2019/0067229 A1 | 2/2019 | Mohammed et al. | |
| 2019/0229054 A1 | 7/2019 | Lu et al. | |
| 2019/0237392 A1 | 8/2019 | Kwon | |
| 2019/0378807 A1 | 12/2019 | Kwon et al. | |

FOREIGN PATENT DOCUMENTS

| | | |
|---|---|---|
| JP | 2005-333007 A | 12/2005 |
| JP | 2006-237278 A | 9/2006 |
| JP | 2007-317979 A | 12/2007 |
| JP | 4374427 B2 | 12/2009 |
| JP | 2011-165862 A | 8/2011 |
| KR | 10-0871067 B1 | 11/2008 |
| KR | 10-2011-0114155 A | 10/2011 |
| KR | 10-2018-0066379 A | 6/2018 |

OTHER PUBLICATIONS

Clarivate Analytics translation of Shimizu. (Year: 2004).*
Non-Final Office Action dated Sep. 2, 2020 in U.S. Appl. No. 16/408,727.
Non-Final Office Action dated Jan. 13, 2021 in U.S. Appl. No. 16/408,727.
Notice of Allowance dated Apr. 29, 2021 in U.S. Appl. No. 16/408,727.
Non-Final Office Action dated Mar. 2, 2023 in U.S. Appl. No. 17/115,093.
Office Action dated Nov. 11, 2022 in Korean Application No. 10-2018-0140467.
Notice of Allowance dated May 9, 2023 in U.S. Appl. No. 17/115,093.

* cited by examiner

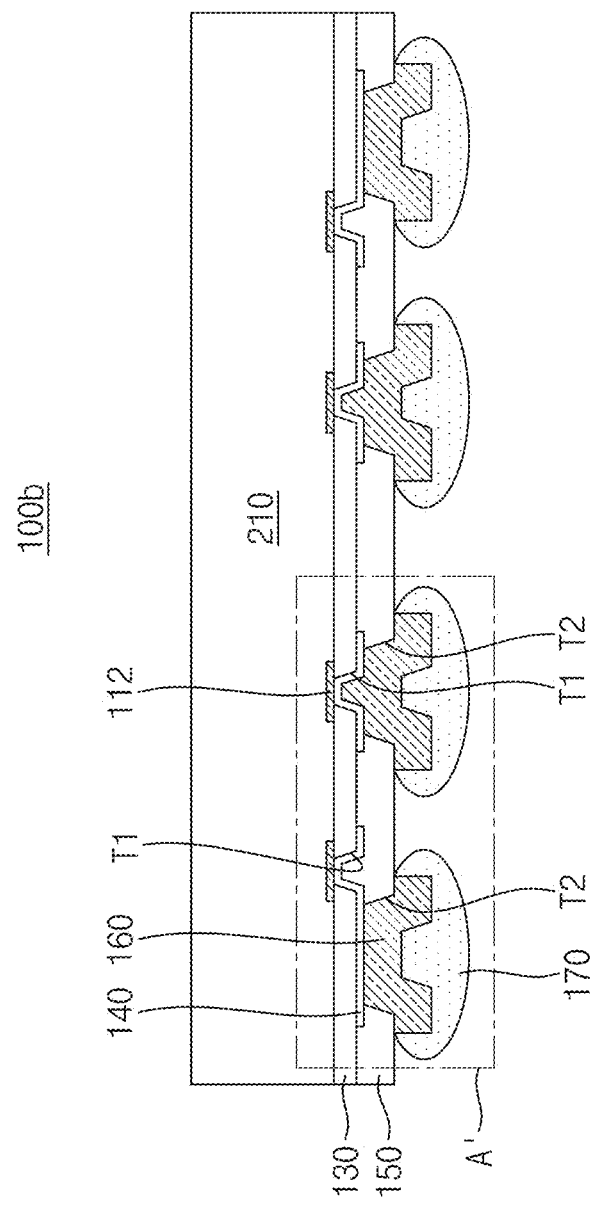

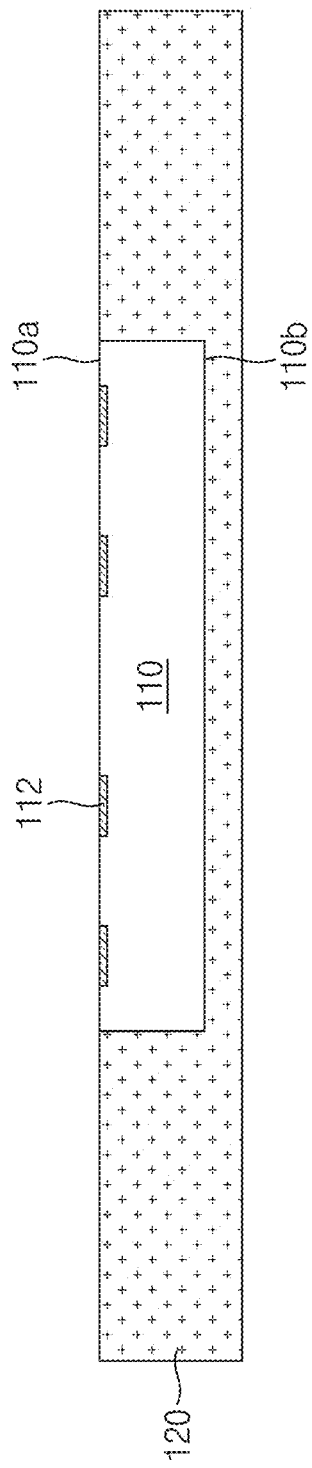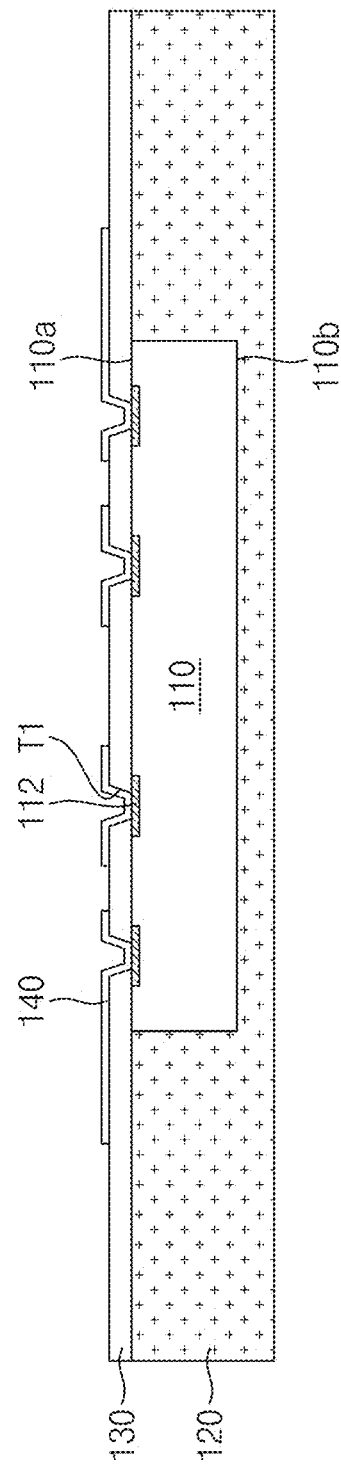

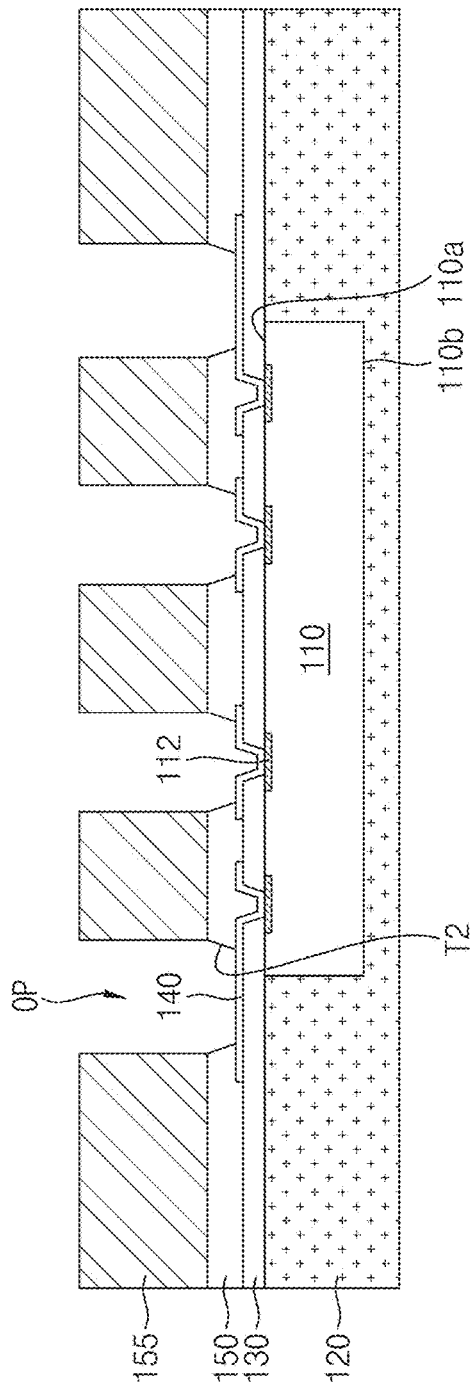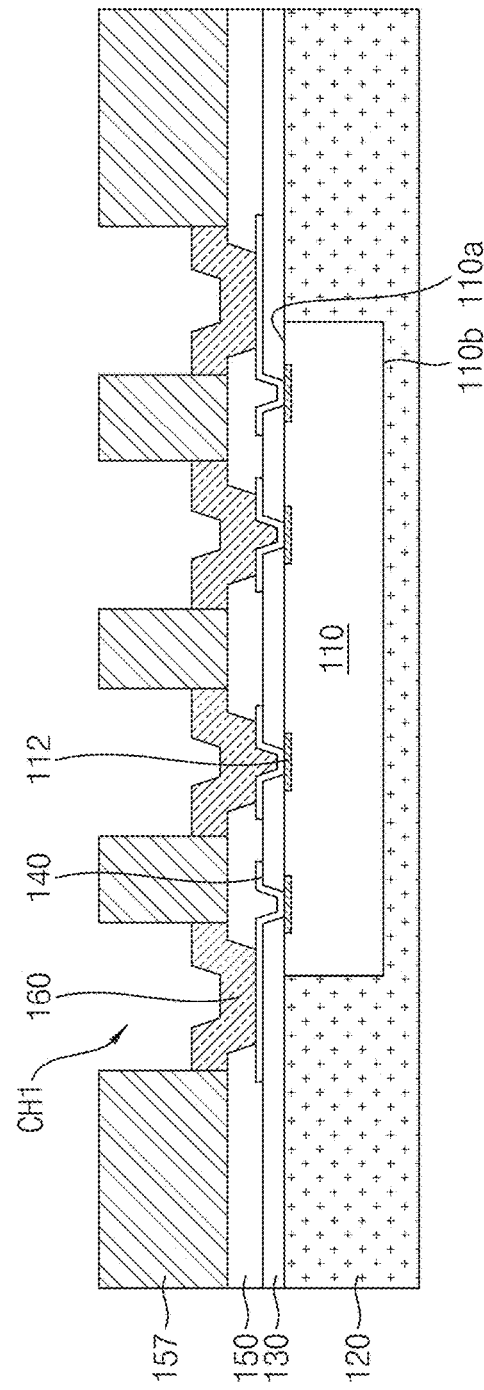

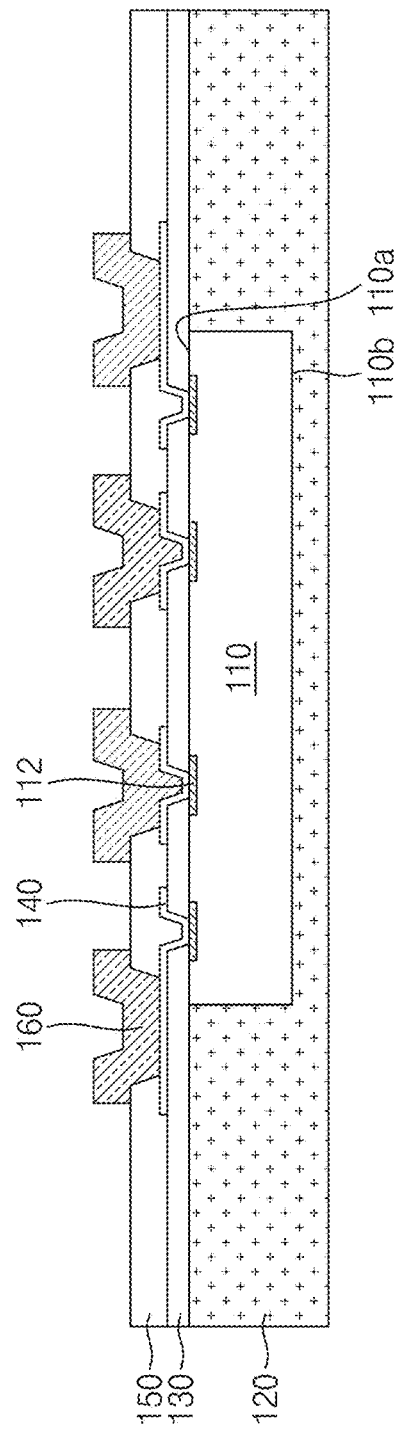
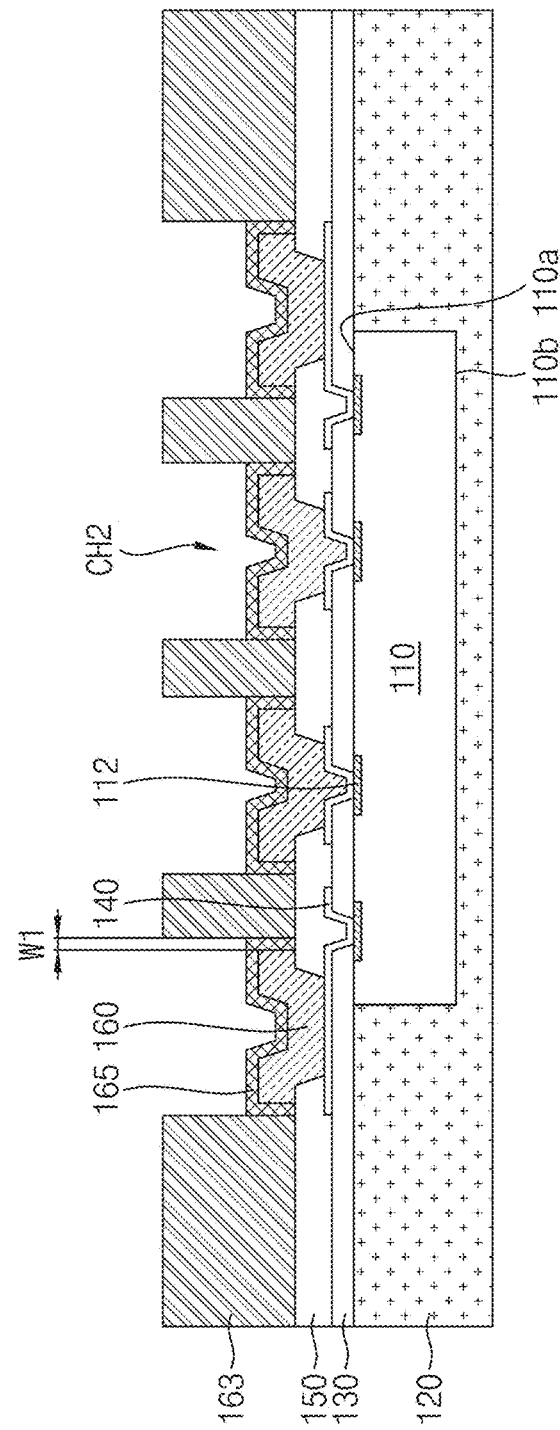

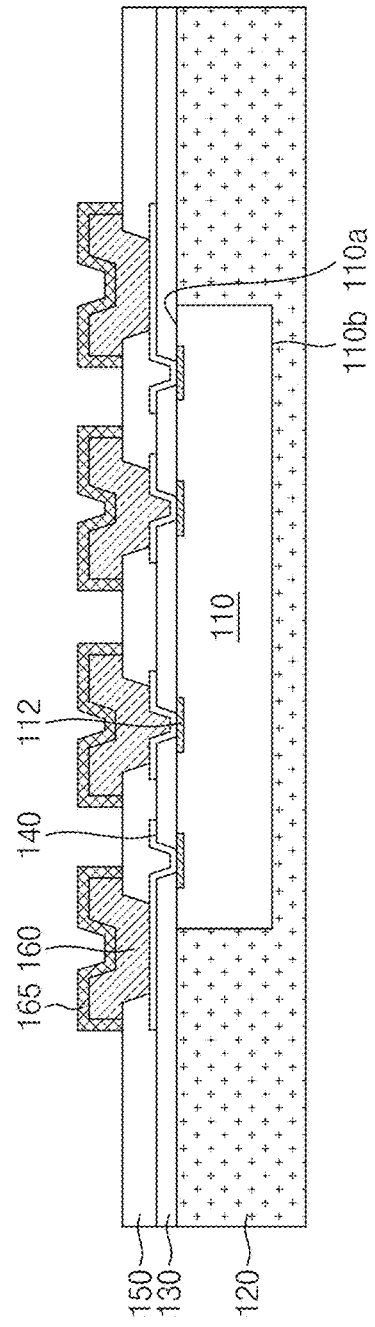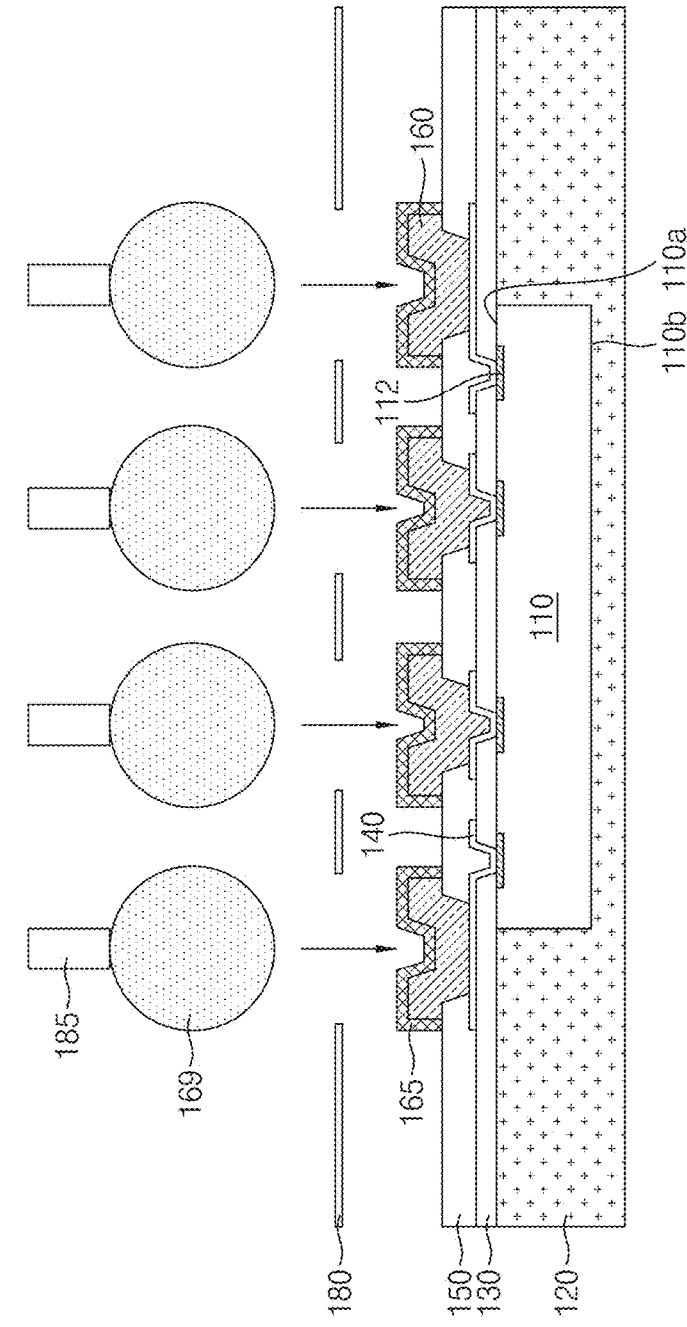

WAFER-LEVEL PACKAGE INCLUDING UNDER BUMP METAL LAYER

CROSS-REFERENCE TO RELATED APPLICATIONS

This U.S. non-provisional application is a Continuation of U.S. application Ser. No. 16/408,727, filed on May 10, 2019, which claims priority under 35 USC § 119 to Korean Patent Application No. 10-2018-0140467, filed on Nov. 15, 2018, the entire contents of each of which are incorporated herein by reference.

BACKGROUND

1. Field

Devices and methods relate to a wafer-level semiconductor package including an under bump metal (UBM) layer and a method of manufacturing the same.

2. Description of Related Art

As electronic products become smaller and/or lighter, semiconductor devices, which are components of electronic devices, may need to be more highly integrated. Thus, a direction in which semiconductor packages are developed is also being changed to adjust to the highly integrated semiconductor devices. In recent years, semiconductor packages, which are actively developed by placing the focus on miniaturization, include flip-chip packages, wafer-level packages, and the like.

A wafer-level package refers to a package formed by packaging a semiconductor chip including a semiconductor device without being separated from a wafer. In the wafer-level package, an external connection electrode is not connected to an electrode pad of the semiconductor chip by external conducting wires but is disposed directly on a surface of the semiconductor chip. Accordingly, since an area occupied by the semiconductor chip when the semiconductor chip is mounted in the wafer-level package is about equal to a size of the semiconductor chip, a size of the wafer-level package is very small.

However, when the wafer-level package is mounted on a main board, stress may be concentrated on a solder bump of the wafer-level package due to a difference in coefficient of thermal expansion between the wafer-level package and the main board.

SUMMARY

Some example embodiments of the inventive concepts are directed to providing a wafer-level semiconductor package in which stress caused by differences in physical properties between the wafer-level semiconductor package and a main board after the wafer-level semiconductor package is mounted on the main board is dispersed to enhance durability of the wafer-level semiconductor package. For example, some example embodiments of the inventive concepts are directed to providing a wafer-level semiconductor package that may reduce or prevent generation of stress due to a difference in coefficient of thermal expansion between the wafer-level semiconductor package and a main board and the resultant reliability degradation of products by reinforcing a structure of an under bump metal (UBM) layer of the wafer-level semiconductor package.

According to some example embodiments, there is provided a wafer-level semiconductor package including a semiconductor chip including a first surface and a second surface, a redistribution layer on the first surface of the semiconductor chip, a UBM layer on the redistribution layer, and a solder bump on the UBM layer. The solder bump covers both outer side surfaces of the UBM layer.

According to some example embodiments, there is provided a wafer-level semiconductor package module including a main board on which a terminal is disposed and a wafer-level semiconductor package mounted on the main board. The wafer-level semiconductor package includes a semiconductor chip having one surface on which a connection pad is disposed, a first passivation layer configured to cover the one surface of the semiconductor chip, a redistribution layer on the first passivation layer, a second passivation layer configured to cover the first passivation layer, the second passivation layer including a trench exposing a portion of the redistribution layer, a UBM layer in the trench and on the second passivation layer, and a solder bump configured to cover both side surfaces of the UBM layer, the solder bump connected to the terminal of the main board. A thickness of the UBM layer is 50% of a thickness of the solder bump.

According to some example embodiments, there is provided a method of manufacturing a wafer-level semiconductor package. The method includes forming a redistribution layer on a semiconductor chip, forming a UBM layer on the redistribution layer, forming a preliminary solder layer to cover a surface of the UBM layer, providing flux to a top surface of the preliminary solder layer, dropping a solder ball on the preliminary solder layer and the flux, and reflowing the preliminary solder layer, the flux, and the solder ball and forming a solder bump.

BRIEF DESCRIPTION OF THE DRAWINGS

FIG. 1B is a schematic cross-sectional view of a wafer-level semiconductor package according to some example embodiments of the inventive concepts.

FIGS. 17 to 25 are cross-sectional views illustrating a method of manufacturing a wafer-level package according to some example embodiments of the inventive concepts.

DETAILED DESCRIPTION OF EXAMPLE EMBODIMENTS

Figure 1A:
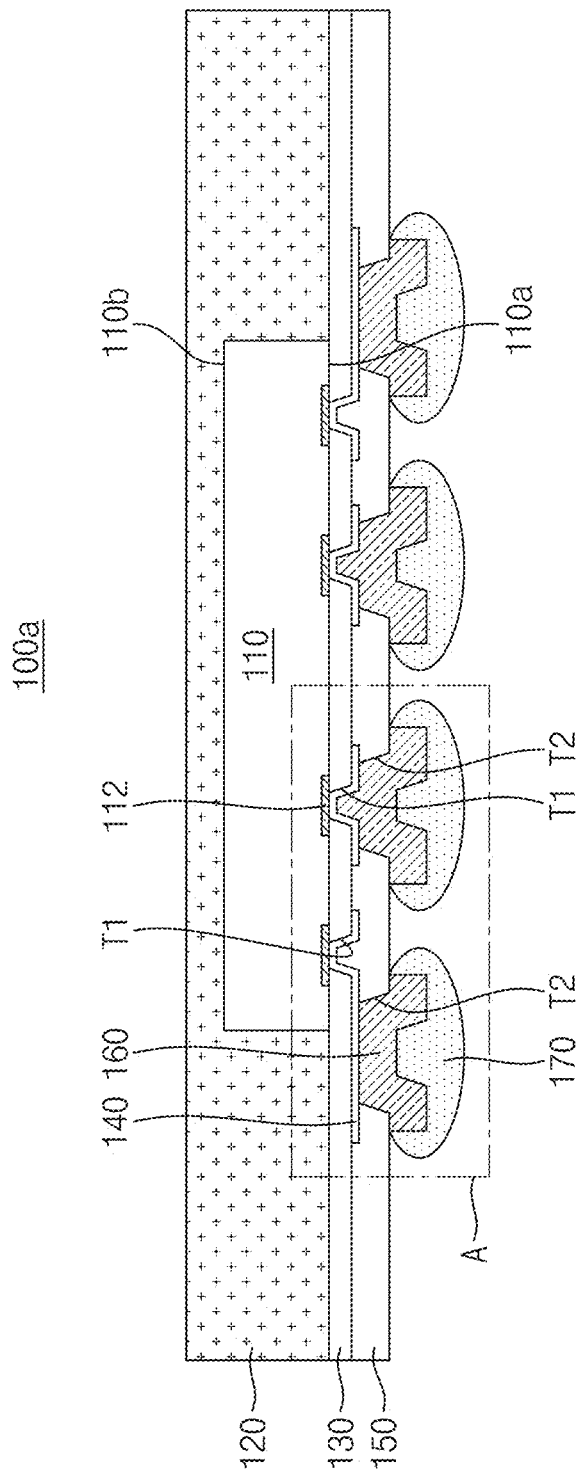
FIG. 1A is a schematic cross-sectional view of a wafer-level semiconductor package according to some example embodiments of the inventive concepts.

FIG. 1A is a schematic cross-sectional view of a wafer-level semiconductor package according to some example embodiments of the inventive concepts. FIG. 1B is a schematic cross-sectional view of a wafer-level semiconductor package according to some example embodiments of the inventive concepts.

Referring to FIG. 1A, a wafer-level semiconductor package 100a may include a semiconductor chip 110, a mold layer 120, a first passivation layer 130, a redistribution layer 140, a second passivation layer 150, an under bump metal (UBM) layer 160, and/or a solder bump 170. For example, the wafer-level semiconductor package 100a may be a fan-out wafer-level semiconductor.

The semiconductor chip 110 may be, for example, a memory chip, a logic chip, or the like. When the semiconductor chip 110 is a memory chip or a logic chip, the semiconductor chip 110 may be variously designed considering operations to be performed. When the semiconductor chip 110 is a memory chip, the memory chip may be, for example, a non-volatile memory chip or a volatile memory chip. The non-volatile memory chip may be a flash memory chip, for example, a NAND flash memory chip, a NOR flash memory chip, or the like. The volatile memory chip may be dynamic random access memory (DRAM), static RAM (SRAM), or embedded RAM but is not limited thereto. When the semiconductor chip 110 is a logic chip, the logic chip may include a central processing unit (CPU) or a graphics processing unit (GPU).

The semiconductor chip 110 may include a connection pad 112. The connection pad 112 may be disposed on a first surface 110a of the semiconductor chip 110 (a bottom surface of the semiconductor chip 110 on the basis of FIG. 1A). As shown in FIG. 1A, the connection pad 112 may be disposed in the semiconductor chip 110 or disposed on the bottom surface of the semiconductor chip 110. Although FIG. 1A illustrates a case in which four connection pads 112 are formed, the inventive concepts are not limited thereto. The connection pad 112 may include a conductive material such as aluminum (Al) or the like.

The mold layer 120 may cover a sidewall of the semiconductor chip 110 and expose the first surface 110a on which the connection pad 112 is disposed. The mold layer 120 may cover a second surface 110b of the semiconductor chip 110, but the inventive concepts are not limited thereto. For example, the mold layer 120 may include an epoxy molding compound (EMC). The mold layer 120 may be formed to have a greater thickness than the semiconductor chip 110 on the outside of the semiconductor chip 110 and cover the second surface 110b of the semiconductor chip 110, but the inventive concepts are not limited thereto, and the mold layer 120 may have the same thickness as the semiconductor chip 110 on the outside of the semiconductor chip 110 and expose the second surface 110b the semiconductor chip 110. Alternatively, the mold layer 120 may be formed to have a smaller thickness than the semiconductor chip 110 and may not cover a portion of the sidewall of the semiconductor chip 110.

The first passivation layer 130 may be disposed under the semiconductor chip 110. The first passivation layer 130 may cover the first surface 110a of the semiconductor chip 110 and a bottom surface of the mold layer 120. A first trench T1 may be formed in the first passivation layer 130 to expose at least a portion of the connection pad 112. The first passivation layer 130 may include an insulating material configured to protect a lower portion of the semiconductor chip 110. For example, the first passivation layer 130 may include at least one of an oxide film or a nitride film.

The redistribution layer 140 extends on the first surface 110a and a bottom surface of the mold layer 120. The redistribution layer 140 may be disposed under the first passivation layer 130. The redistribution layer 140 may partially cover a surface of the first passivation layer 130. One end and the other end of the redistribution layer 140 may extend in both outward directions of the first trench T1 along a bottom surface of the first passivation layer 130. In some example embodiments, the one end of the redistribution layer 140 may extend lengthwise from the semiconductor chip 110 toward the mold layer 120. One side portion of the redistribution layer 140 may have a different length from the other side portion thereof. The redistribution layer 140 may be in contact with the connection pad 112 through the first trench T1. The redistribution layer 140 may be electrically connected to the connection pad 112. The redistribution layer 140 may be formed of a conductive material, e.g., copper, nickel, a copper alloy, or the like, so that the connection pad 112 may be electrically connected to the UBM layer 160.

The second passivation layer 150 may be disposed under the first passivation layer 130 and the redistribution layer 140. The second passivation layer 150 may be formed of the same material as the first passivation layer 130, but the inventive concepts are not limited thereto. A second trench T2 may be formed in the second passivation layer 150 to expose at least a portion of the redistribution layer 140.

The UBM layer 160 may be disposed inside the second trench T2 under the redistribution layer 140. The UBM layer 160 may extend outwardly downward from the second trench T2 and be in contact with a bottom surface of the second passivation layer 150. The UBM layer 160 may be disposed to be collinear with the redistribution layer 140 and the connection pad 112 in a sectional view thereof. In some example embodiments, one end of the redistribution layer 140 may extend lengthwise toward the mold layer 120, and the UBM layer 160 may be in contact with the lengthwise extended portion of the redistribution layer 140 and thus, a center of the UBM layer 160 may deviate from a center of the connection pad 112 in a top view thereof. That is, the UBM layer 160 may be disposed in a position that does not overlap the connection pad 112. The UBM layer 160 may be in contact with the redistribution layer 140 through the second trench T2 of the second passivation layer 150. The UBM layer 160 may be electrically connected to the semiconductor chip 110 through the redistribution layer 140 and the connection pad 112. For example, the UBM layer 160 may be formed by depositing various metals, such as copper (Cu), chromium (Cr), nickel (Ni), titanium-tungsten (TiW), nickel-vanadium (NiV), and the like, by using a sputtering process.

The solder bump 170 may be disposed on the UBM layer 160. The solder bump 170 may completely cover an exposed surface of the UBM layer 160. That is, the solder bump 170 may cover a bottom surface, both outer side surfaces, and both inner side surfaces of the UBM layer 160. The solder bump 170 may include a tin-silver (Sn—Ag)-based material.

Referring to FIG. 1B, a wafer-level semiconductor package 100b may include a semiconductor chip 210, a connection pad 112, a first passivation layer 130, a redistribution layer 140, a second passivation layer 150, a UBM layer 160, and/or a solder bump 170. For example, the wafer-level semiconductor package 100b may be a fan-in wafer-level semiconductor package. In the present specification, descriptions of the fan-out wafer-level semiconductor package 100a of FIG. 1A may be applied likewise to the fan-in wafer-level semiconductor package 100b of FIG. 1B.

FIGS. 2, 3, and 5 to 9 are enlarged views of region A of FIG. 1A according to some example embodiments. FIG. 4 is an enlarged view of region B of FIG. 3 according to some example embodiments. Example embodiments related to region A of FIG. 1A, which are illustrated in FIGS. 2, 3, and 5 to 9, may be applied likewise to region A' of FIG. 1B. In FIGS. 1A to 9, the same reference numerals are used to denote the same components, and repeated descriptions thereof will be omitted below for brevity.

Referring to FIGS. 2, 3, and 5 to 9, a thickness H1 of the UBM layer 160 may be in the range of 10% to 50% of a thickness H2 of the solder bump 170. The thickness H1 of the UBM layer 160 may be in the range of 40% to 50% of the thickness H2 of the solder bump 170. For example, the thickness H2 of the solder bump 170 refers to a maximum vertical distance from a surface of the second passivation layer 150 to an outer circumferential surface of the solder bump 170. Further, in FIGS. 1A to 9, the thickness H1 of the UBM layer 160 refers to a maximum vertical distance from the surface of the second passivation layer 150 to a bottom surface of the UBM layer 160.

When the wafer-level semiconductor package 100a is mounted on a main board by means of the solder bump 170, stress may be applied to the solder bump 170 due to a difference in coefficient of thermal expansion between the wafer-level semiconductor package 100a and the main board. For example, a coefficient of thermal expansion of a package may be in the range of about 3 PPM to 4 PPM, and a coefficient of thermal expansion of a main board may be about 20 PPM. A coefficient of thermal expansion of the UBM layer 160 may be in the range of about 16 PPM to 17 PPM. When stress is concentrated on the wafer-level semiconductor package 100a, cracks may occur in the solder bump 170 in the vicinity of the UBM layer 160 such as to cause failures in products. The cracks may be mainly formed in the solder bump 170 along the surface of the UBM layer 160. For example, since a wafer-level package (e.g., a fan-out wafer-level package or a fan-in wafer-level package) has a smaller thickness than a main board and a lower coefficient of thermal expansion than the main board, stress may tend to concentrate on the wafer-level package.

Therefore, in the inventive concepts, the thickness H1 of the UBM layer 160 may be increased so that the bottom surface of the UBM layer 160 may be disposed in the vicinity of a diameter of the solder bump 170. Since the solder bump 170 has a largest sectional area in the vicinity of the diameter of the solder bump 170, stress may be dispersed, and propagated areas of cracks may be increased. As a result, reliability degradation of products due to a difference in coefficient of thermal expansion may be solved.

Figure 3:
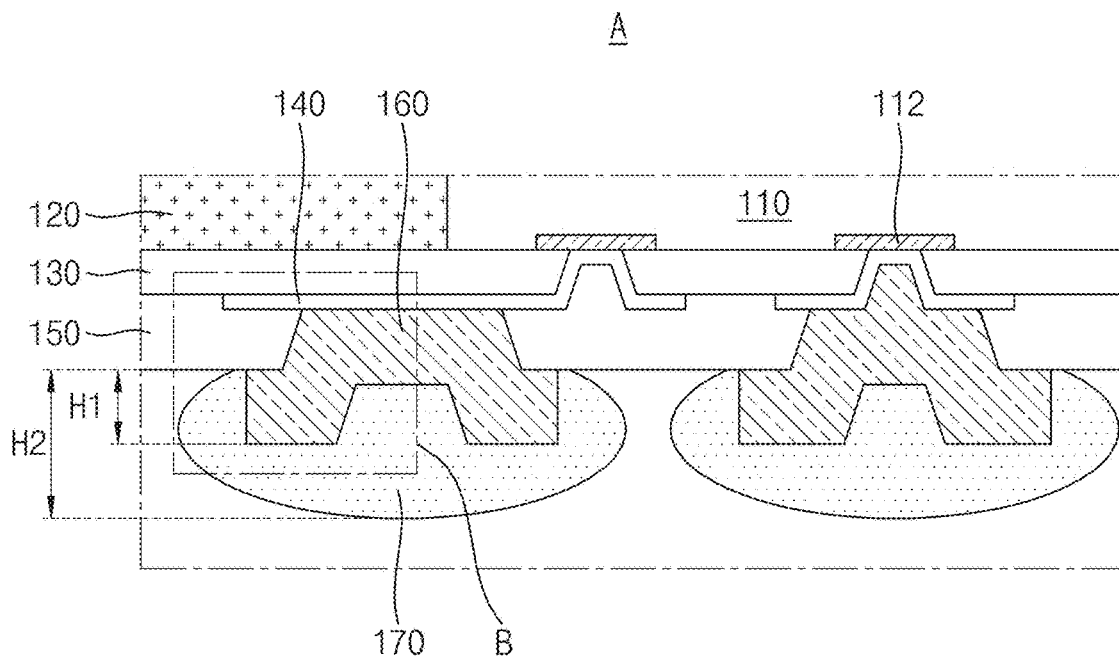
Figure 4:
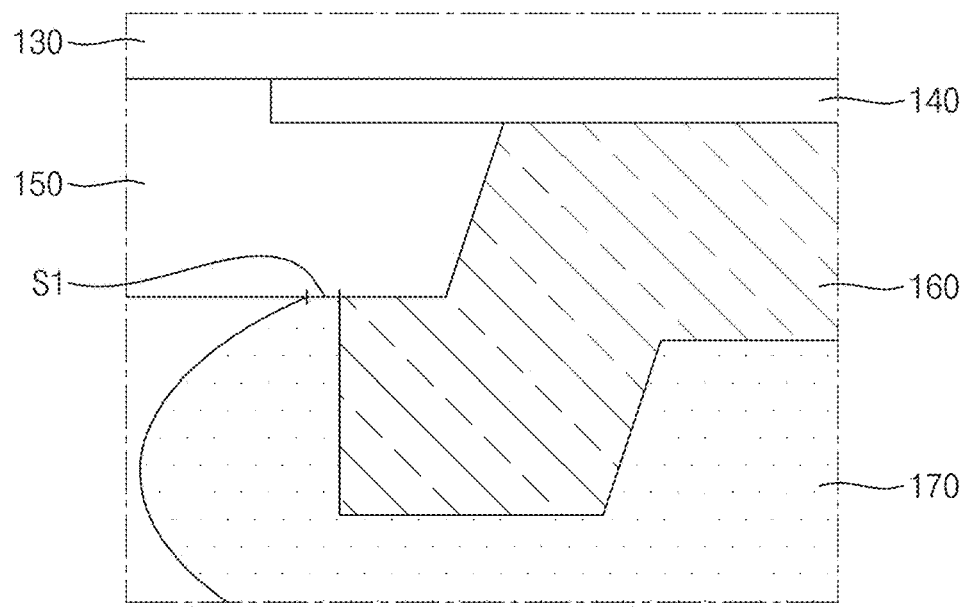
FIG. 4 is an enlarged view of region B of FIG. 3 according to some example embodiments.

Referring to FIGS. 3 and 4, the solder bump 170 may further include a contact surface S1 in contact with the bottom surface of the second passivation layer 150. For instance, the contact surface S1 may be formed when the amount of the solder bump 170 is sufficient as compared to the thickness H1 of the UBM layer 160. Alternatively, the contact surface S1 may be formed by applying pressure to the solder bump 170 from a lower end of the solder bump 170 toward the UBM layer 160.

Figure 5:
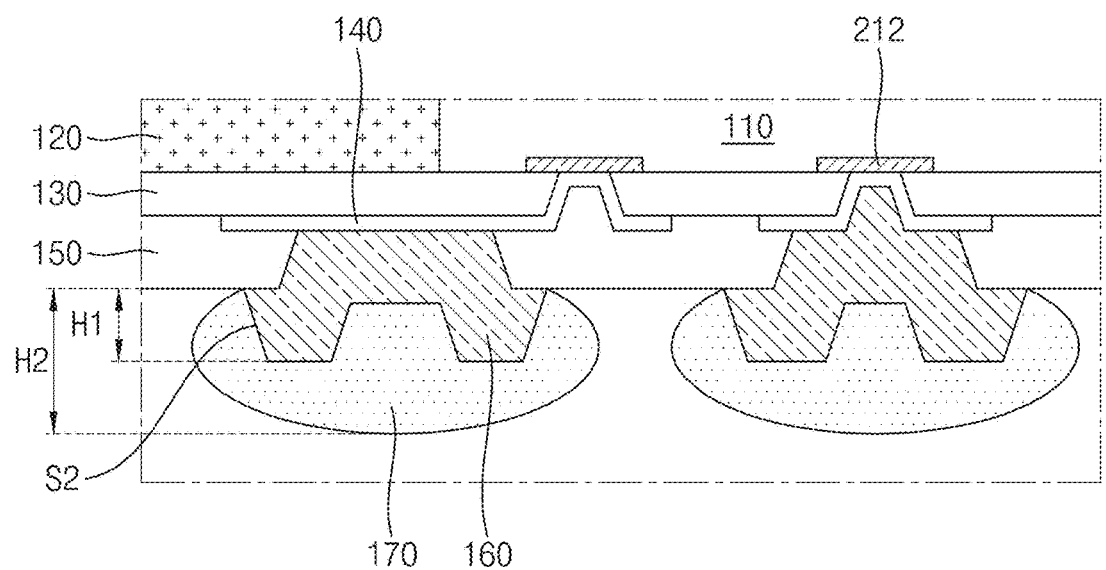

Referring to FIG. 5, both outer side surfaces S2 of the UBM layer 160 that are in contact with the solder bump 170 may be inclined toward an inside of the solder bump 170 with respect to the bottom surface of the second passivation layer 150. When both of the outer side surfaces S2 of the UBM layer 160 are inclined toward the inside of the solder bump 170, the amount of the solder bump 170 formed outside both of the outer side surfaces S2 may be larger than when both of the outer side surfaces S2 are perpendicular to the bottom surface of the second passivation layer 150, and the propagated areas of the cracks may be increased.

Figure 6:
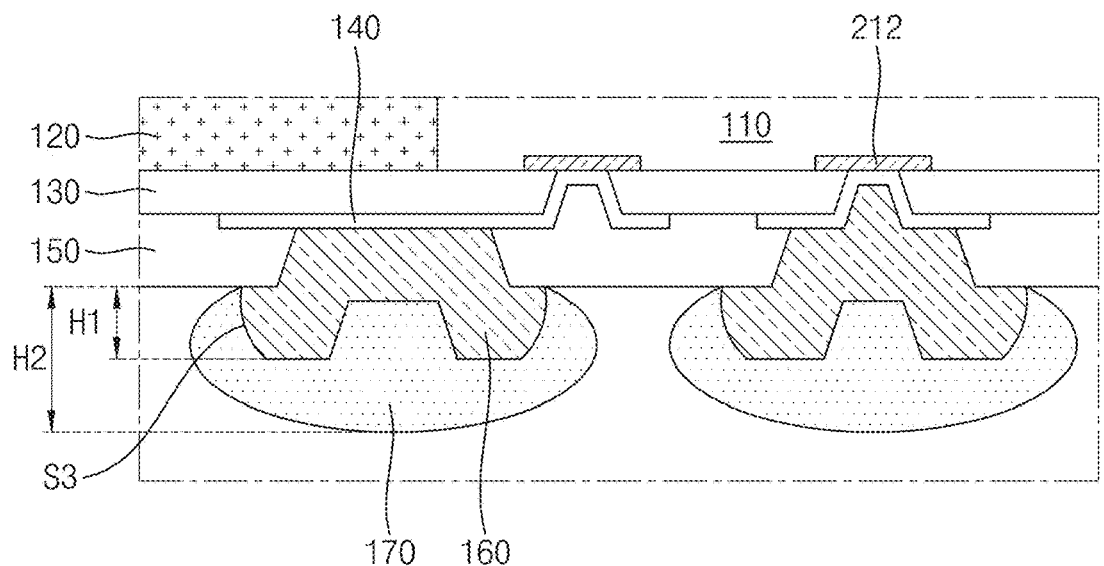
Figure 7:
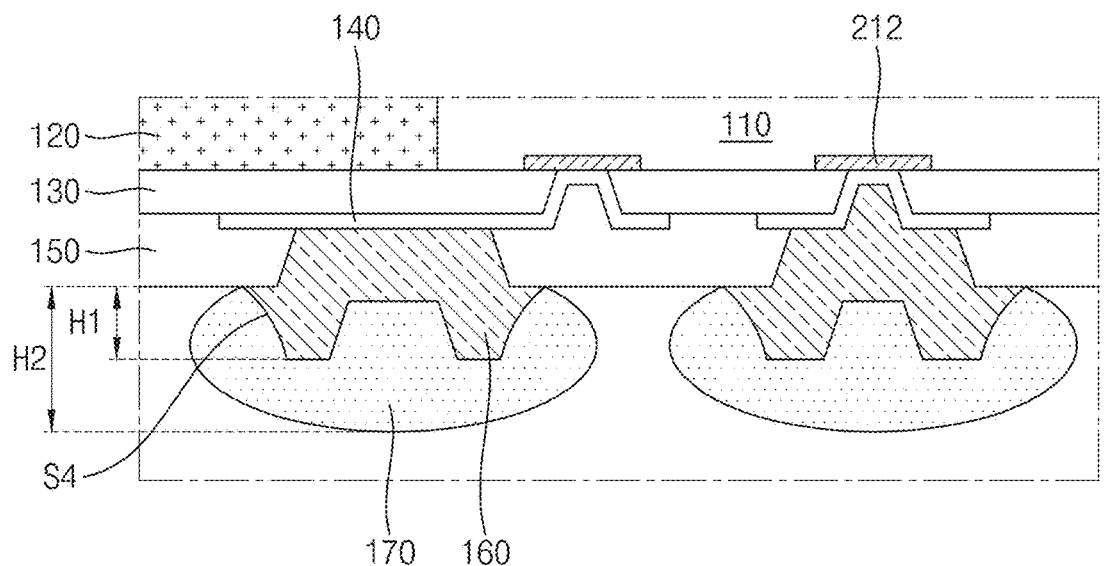

Referring to FIGS. 6 and 7, At least one of the outer side surfaces of the UBM layer 160 may include a curved side surface. Both outer side surfaces S3 and S4 of the UBM layer 160 in contact with the solder bump 170 may include curved surfaces. For example, as shown in FIG. 6, both of the outer side surfaces S3 of the UBM layer 160 may have convex shapes toward an outside of the UBM layer 160. As shown in FIG. 7, both of the outer side surfaces S4 of the UBM layer 160 may have concave shapes toward an inside of the UBM layer 160.

Figure 8:
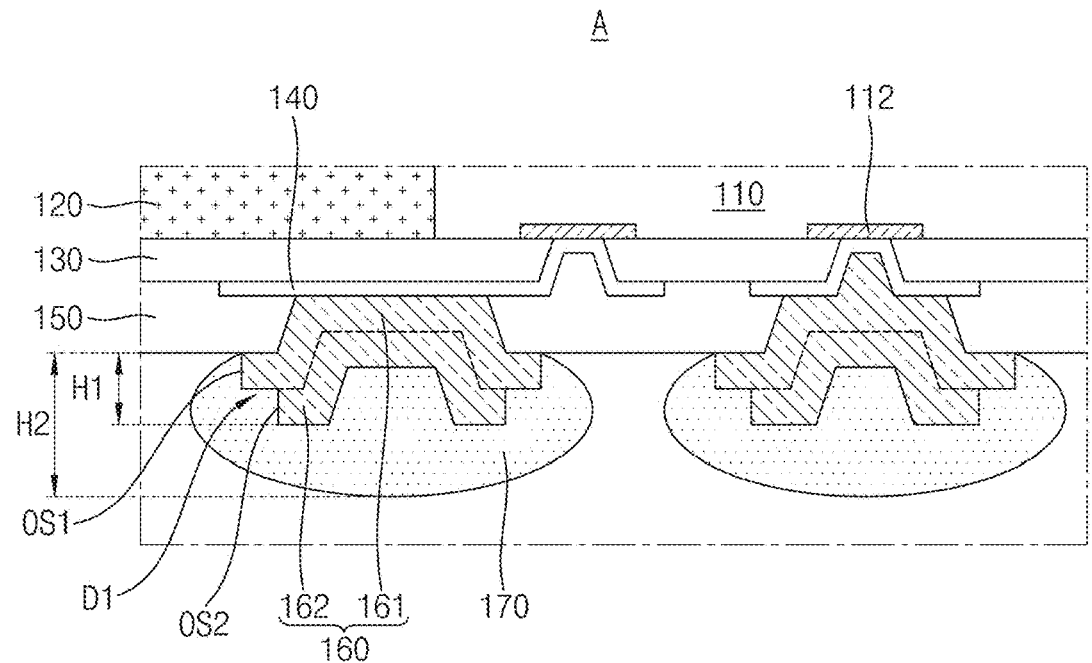

Referring to FIG. 8, the UBM layer 160 may include a first UBM layer 161 and a second UBM layer 162. A top surface of the first UBM layer 161 may be in contact with the redistribution layer 140. Further, the first UBM layer 161 may be in contact with the surface of the second passivation layer 150. The second UBM layer 162 may be in contact with a bottom surface of the first UBM layer 161. The first UBM layer 162 may have a different thickness from the second UBM layer 162. The second UBM layer 162 may have a width smaller than that of the first UBM layer 161. Thus, a first outer side surface OS1 of the first UBM layer 161 and a second outer side surface OS2 of the second UBM layer 162 may be formed to have a step D1 at both side portions of the UBM layer 160 that are in contact with the solder bump 170. Furthermore, a lowest surface of the first UBM layer 161 and a lowest surface of the second UBM layer 162 may be formed to have a step D1.

Figure 9:
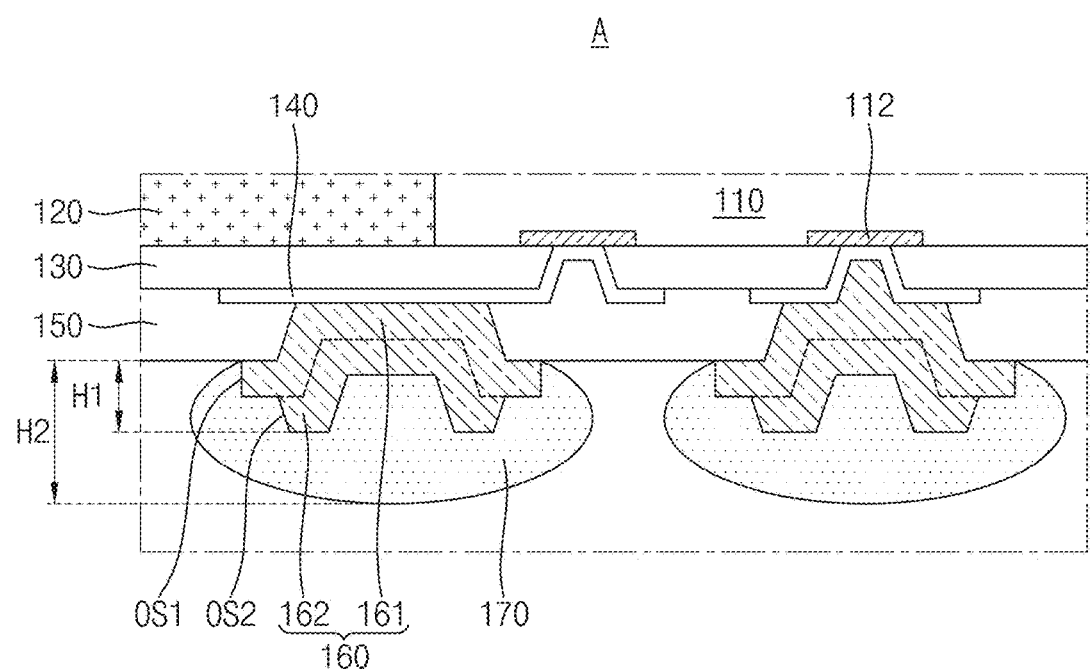

Referring to FIG. 9, at least one of the first outer side surface OS1 and the second outer side surface OS2 may be inclined toward the inside of the solder bump 170 with respect to the surface of the second passivation layer 150.

Figure 2:
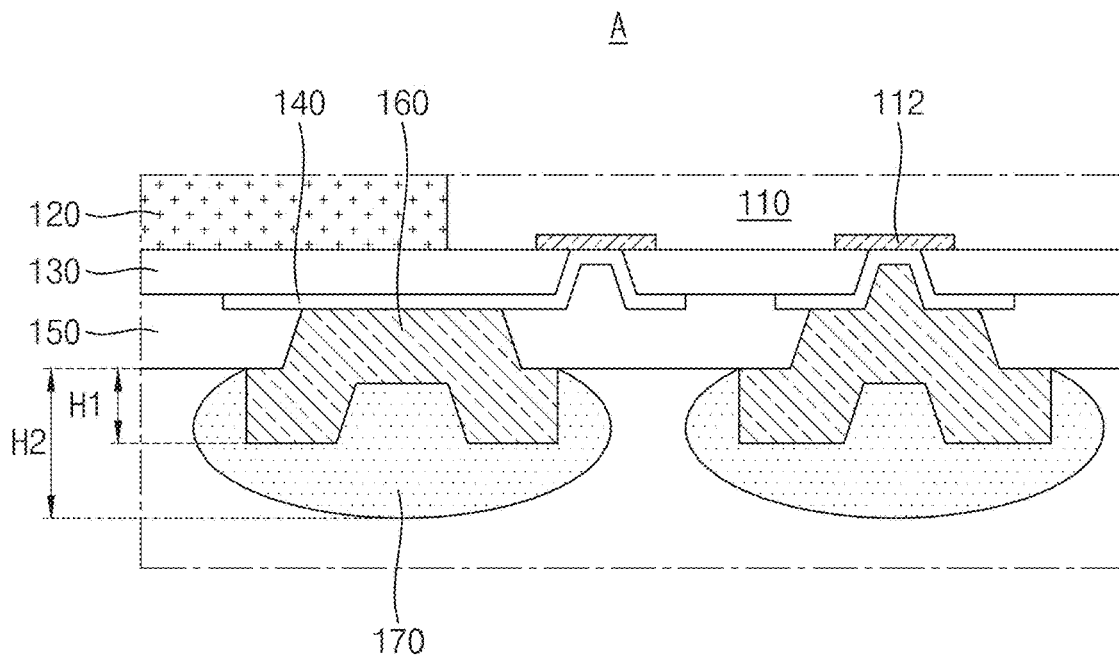
FIGS. 2, 3, and 5 to 9 are enlarged views of region A of FIG. 1A according to some example embodiments.

In the case of FIGS. 6 to 9, as shown in FIG. 5, the amount of the solder bump 170 formed on both outer sides of the UBM layer 160 may be increased more than in the case of FIG. 2, and propagated areas of cracks may be increased. In the case of FIGS. 7 to 9, the amount of the solder bump 170 formed on both of the outer sides of the UBM layer 160 may be larger than the amount of the solder bump 170 formed on both of the outer sides of the UBM layer 160 of FIG. 5, and the propagated areas of the cracks may be further increased.

Figure 10A:
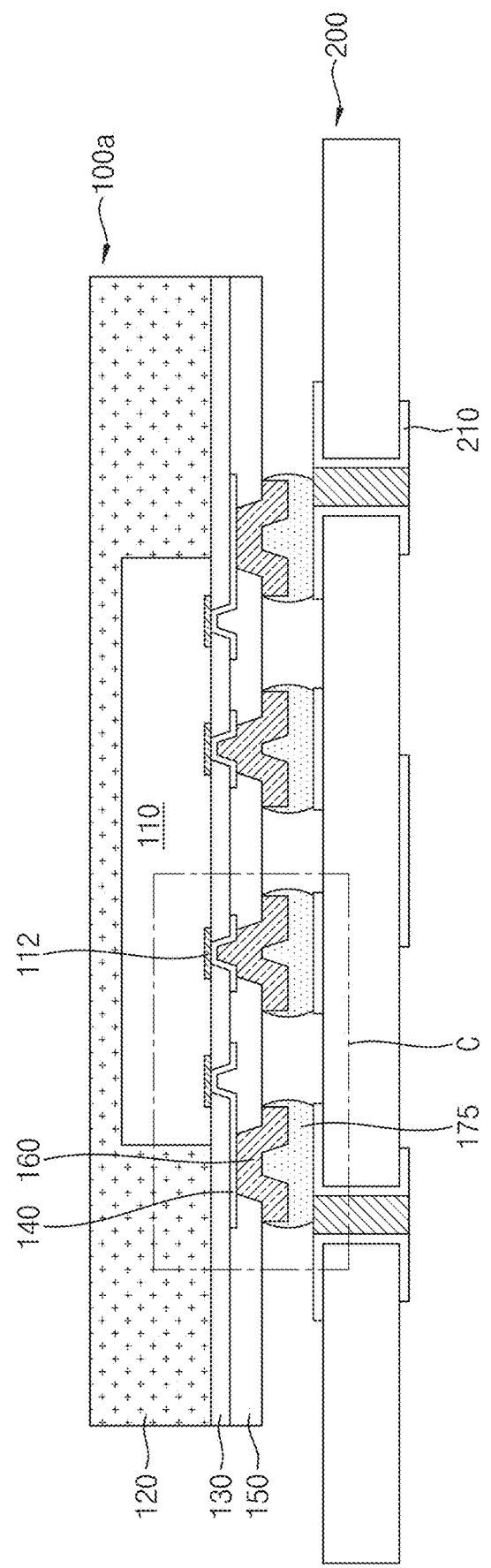
FIG. 10A is a schematic cross-sectional view of a case in which a wafer-level semiconductor package according to some example embodiments of the inventive concepts is mounted on a main board of an electronic device.
Figure 10B:
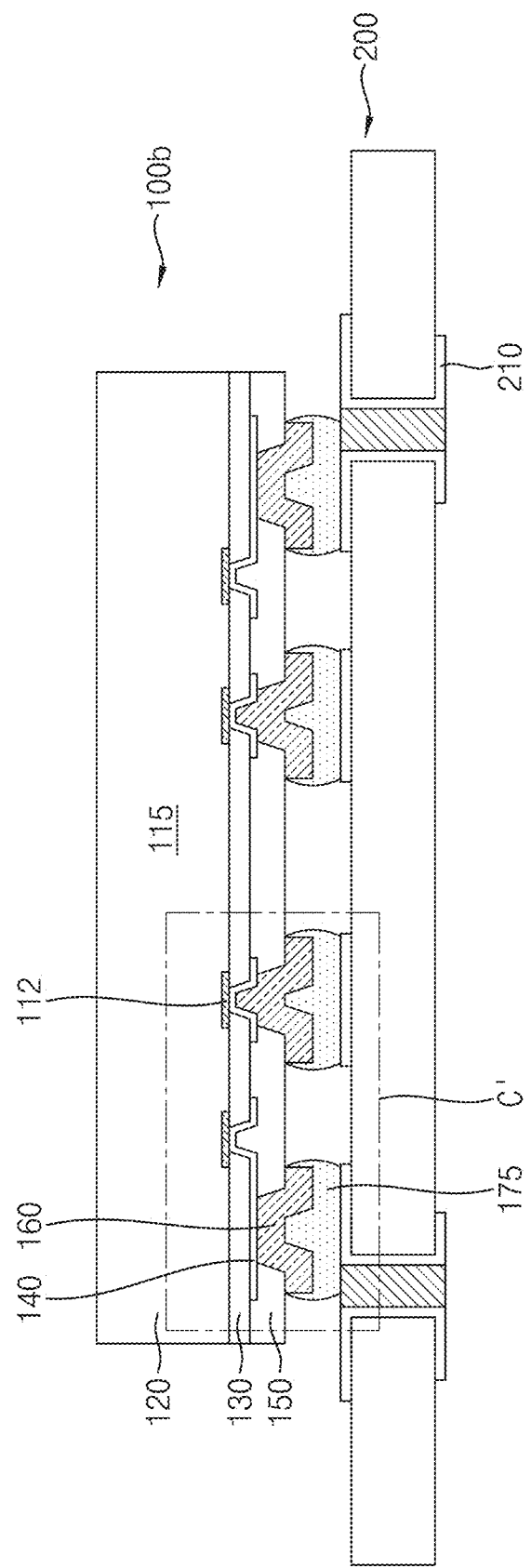
FIG. 10B is a schematic cross-sectional view of a case in which a wafer-level semiconductor package according to some example embodiments of the inventive concepts is mounted on a main board of an electronic device.

FIG. 10A is a schematic cross-sectional view of a case in which a wafer-level semiconductor package according to some example embodiments of the inventive concepts is mounted on a main board of an electronic device. FIG. 10B is a schematic cross-sectional view of a case in which a wafer-level semiconductor package according to some example embodiments of the inventive concepts is mounted on a main board of an electronic device. FIGS. 11, 12, and 14 to 16 are enlarged cross-sectional views of region C of FIG. 10A according to some example embodiments. FIG. 13 is an enlarged cross-sectional view of region D of FIG. 10A according to some example embodiments. The example embodiment illustrated in FIGS. 11, 12, and 14 to 16 may be applied likewise to region C' of FIG. 10B. In FIGS. 1A to 16, the same reference numerals are used to denote the same components, and repeated descriptions thereof will be omitted below for brevity.

Referring to FIGS. 10A and 10B, the wafer-level semiconductor package 100a or 100b may be mounted on a main board 200 of an electronic device through a solder bump 175 or the like. The mounted wafer-level semiconductor package 100a or 100b and the main board 200 may constitute a wafer-level semiconductor package module. For example, the wafer-level semiconductor package 100a or 100b may be a fan-out semiconductor package 100a or a fan-in semiconductor package 100b. The inventive concepts are applied to a wafer-level semiconductor package, which may be mounted on the main board 200 of the electronic device without an additional interposer substrate or the like. Although only the fan-out wafer-level semiconductor package 100a and the fan-in wafer-level semiconductor package 100b are illustrated in FIGS. 10A and 10B, the inventive concepts may be applied to other types of wafer-level packages.

Figure 11:
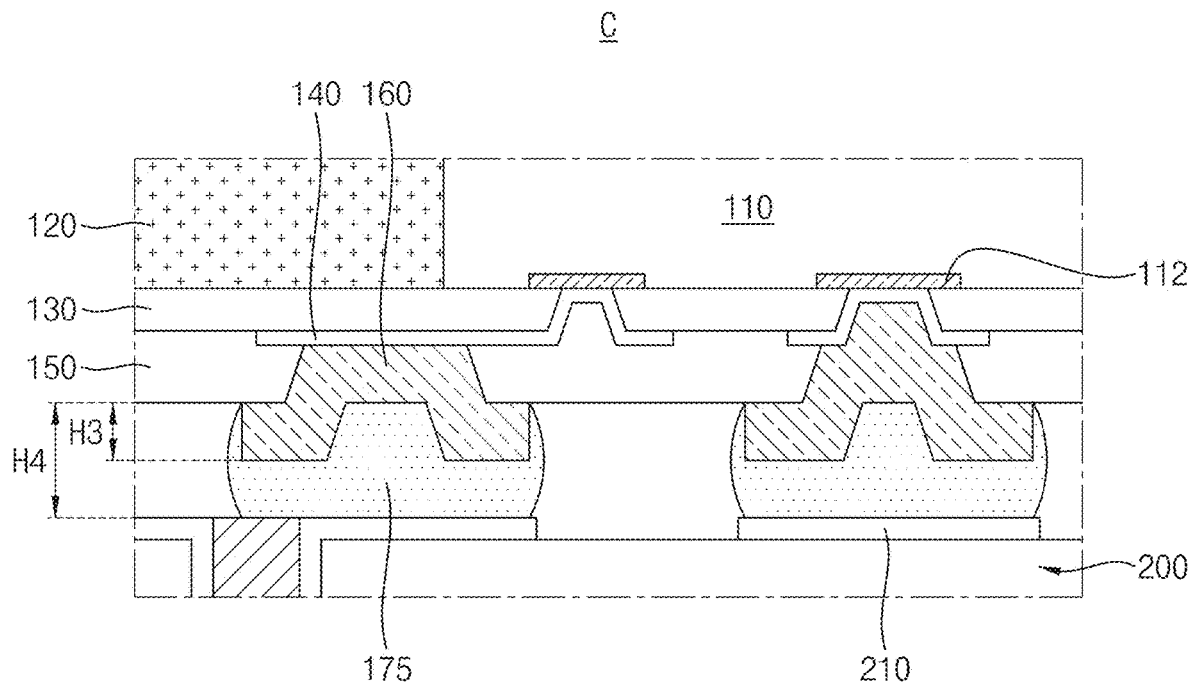
FIGS. 11, 12, and 14 to 16 are enlarged cross-sectional views of region C of FIG. 10A according to some example embodiments.

Referring to FIGS. 10A and 11, a thickness H3 of the UBM layer 160 may be 50% of a thickness H4 of the solder bump 175. For example, in FIGS. 10A to 16, the thickness H4 of the solder bump 175 refers to a vertical distance from a surface of the second passivation layer 150 to a surface of a terminal 210 that is in contact with the solder bump 175 on the main board 200. Further, in FIGS. 10A to 16, the thickness H3 of the UBM layer 160 refers to a maximum vertical distance from the surface of the second passivation layer 150 to a bottom surface of the UBM layer 160.

Figure 12:
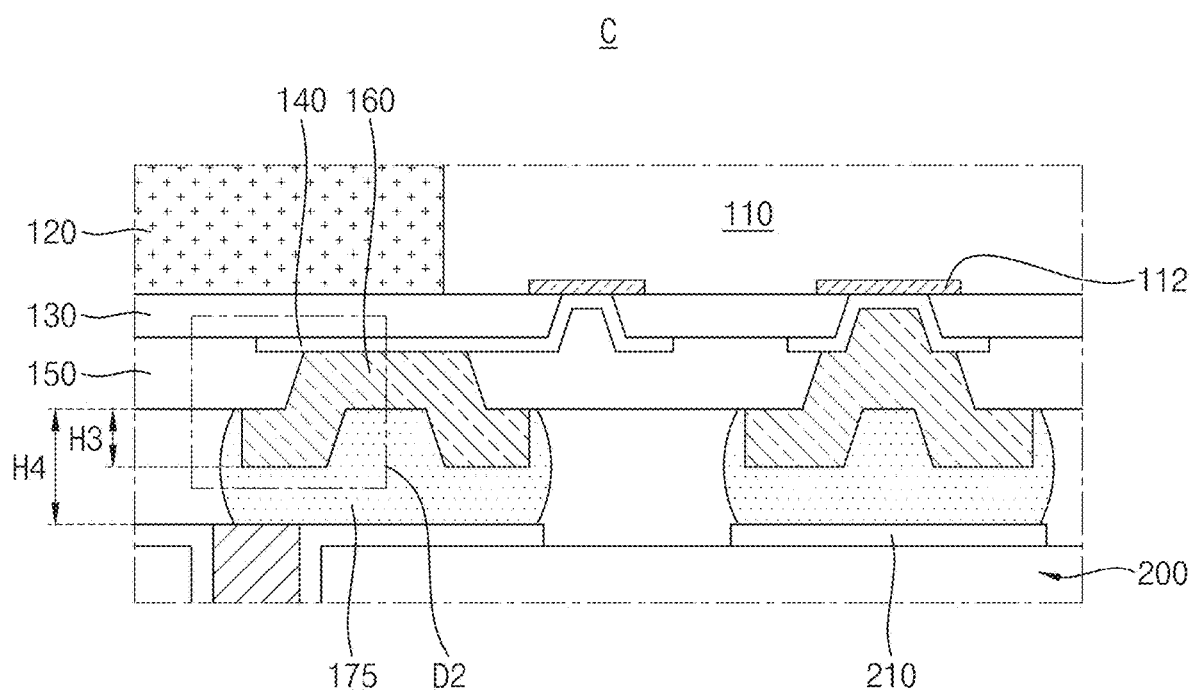
Figure 13:
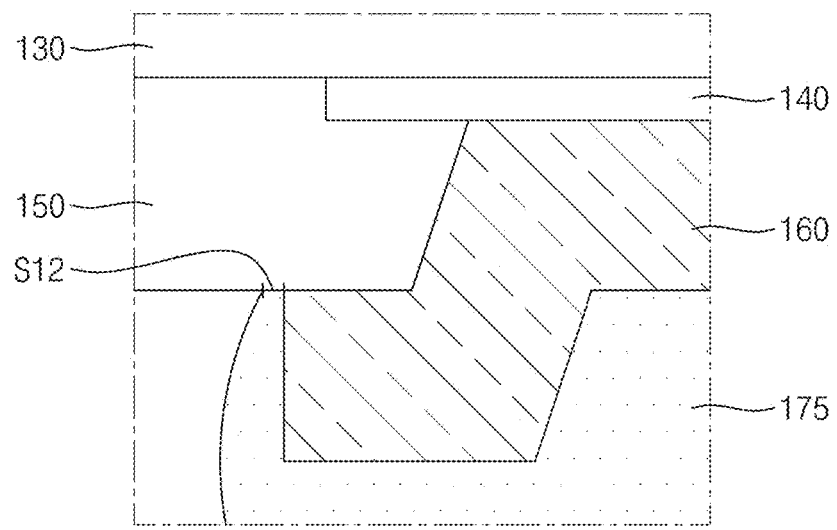
FIG. 13 is an enlarged cross-sectional view of region D of FIG. 10A according to some example embodiments.

Referring to FIGS. 12 and 13, in a similar manner to that described with reference to FIGS. 3 and 4, the solder bump 175 may further include a contact surface S12 which is in contact with a bottom surface of the second passivation layer 150. For example, the contact surface S12 may be formed by pressing the solder bump 175 against the bottom surface of the second passivation layer 150 with pressure applied to the solder bump 175 when the wafer-level semiconductor package 100a is mounted on the main board 200.

Figure 14:
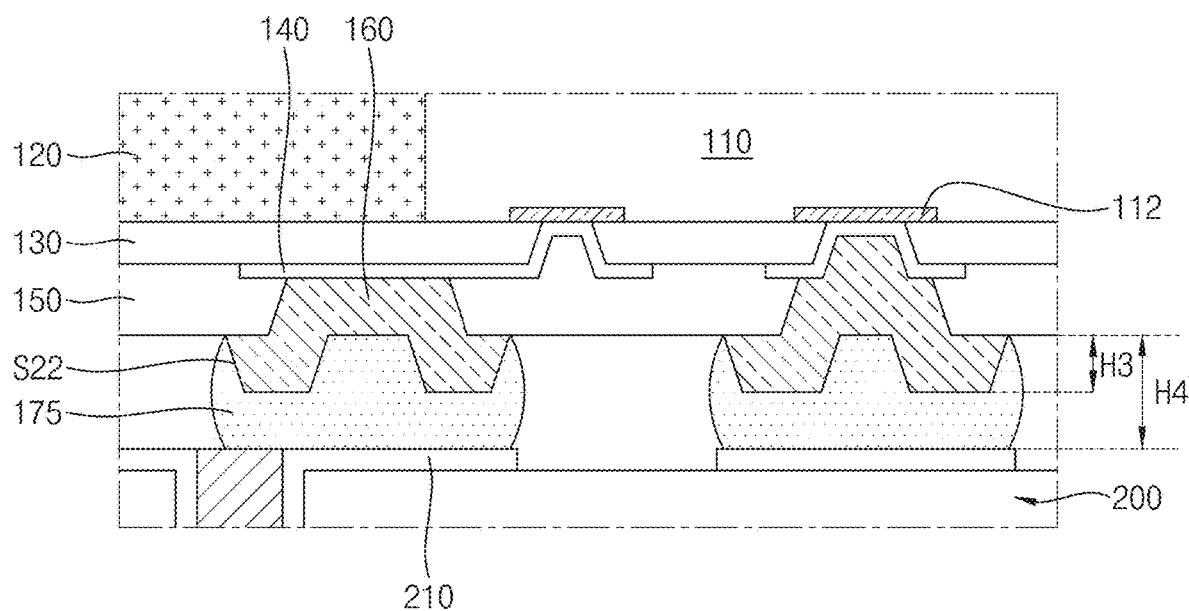

Referring to FIG. 14, outer side surfaces S22 of both outer side portions of the UBM layer 160 may be inclined toward an inside of the UBM layer 160 with respect to the bottom surface of the second passivation layer 150. Although the outer side surfaces S22 of the UBM layer 160 are illustrated as straight lines in FIG. 14, the outer side surfaces S22 may have a curved shape as in FIGS. 6 and 7.

Figure 15:
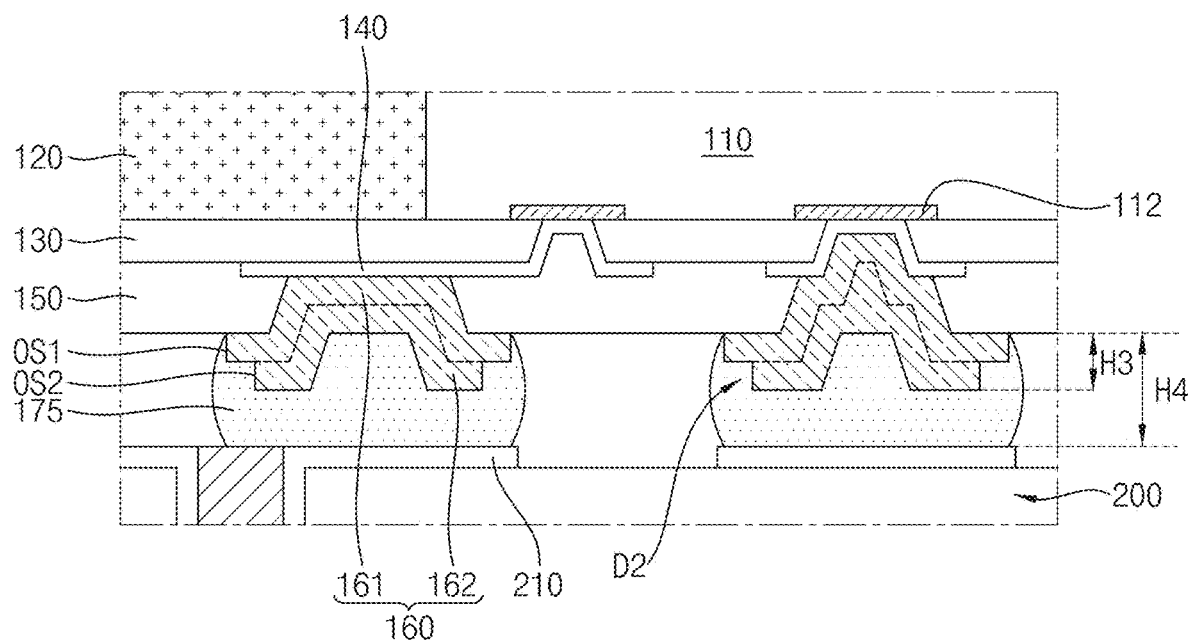

Referring to FIG. 15, both outer side portions of the UBM layer 160 may have a first outer side surface OS1 and a second outer side surface OS2 which have a step D2.

Figure 16:
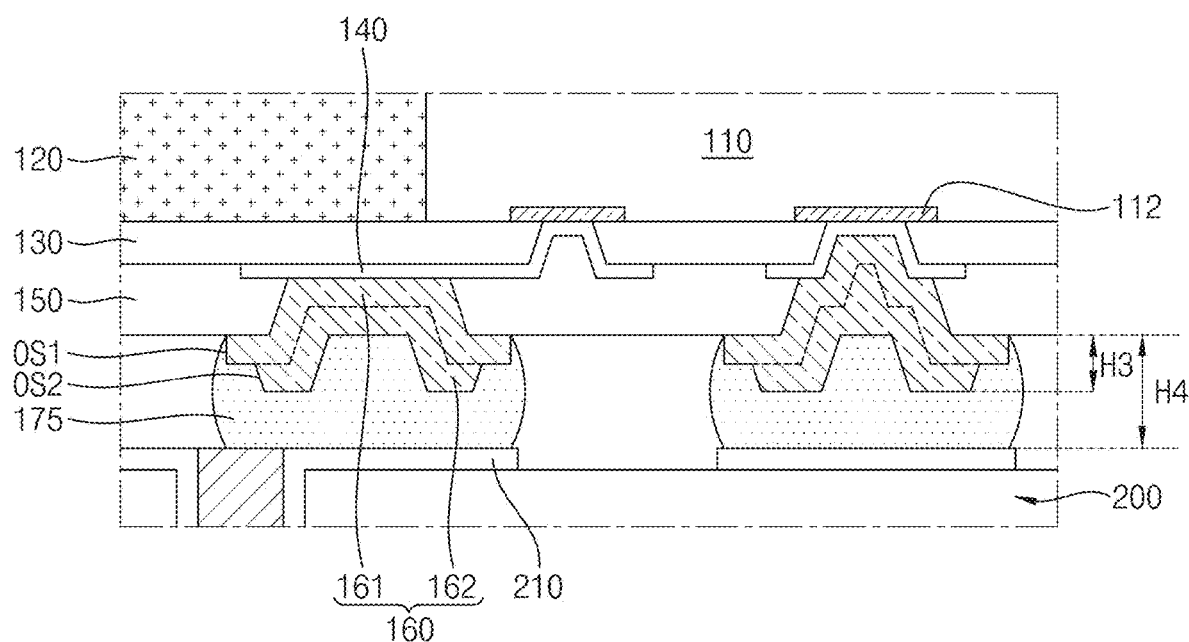

Referring to FIG. 16, at least one of the first outer side surface OS1 and the second outer side surface OS2 may be inclined with respect to a surface of the second passivation layer 150.

FIGS. 17 to 25 are cross-sectional views illustrating a method of manufacturing a wafer-level package according to some example embodiments of the inventive concepts. In FIGS. 1A to 25, the same reference numerals are used to denote the same components, and repeated descriptions thereof will be omitted below for brevity. Only one wafer-level package is illustrated in each cross-sectional view for brevity. In an actual manufacturing process, each of the following processes may be performed simultaneously on a plurality of wafer-level packages that are individually separated from a wafer.

Referring to FIG. 17, a semiconductor chip 110 and a mold layer 120 configured to surround a portion of a surface of the semiconductor chip 110 may be formed. For example, a first surface 110a of the semiconductor chip 110 may be adhered to a support frame (not shown) through tape. The mold layer 120 may be formed to cover a side surface and/or a second surface 110b of the semiconductor chip 110. The mold layer 120 may be formed by molding and curing an epoxy molding compound (EMC). The mold layer 120 and the semiconductor chip 110 may be separated from the tape, and the first surface 110a of the semiconductor chip 110 and a connection pad 112 disposed on the first surface 110a may be exposed. The mold layer 120 may have a sufficient thickness, and thus, the bending of the semiconductor chip 110 may be reduced or prevented when the mold layer 120 and the semiconductor chip 110 are separated from the tape. Alternatively, the support frame may be removed using a back-grinding process, and the tape may be removed using a heating process. A process of individualizing the mold layer 120 and the semiconductor chip 11 from the support frame and the tape may be performed after a UBM layer 160 to be described below is formed.

Referring to FIG. 18, a first passivation layer 130 may be formed on the semiconductor chip 110 and the mold layer 120. A first trench T1 may be formed in the first passivation layer 130 to expose the connection pad 112 of the semiconductor chip 110. A redistribution layer 140 may be formed inside the first trench T1 and brought into contact with the connection pad 112. The redistribution layer 140 may be exposed outside the first trench T1 and partially cover the first passivation layer 130. The first passivation layer 130 in which the first trench T1 is formed may be formed using a photolithography process including an exposure process and a developing process.

Referring to FIG. 19, a second passivation layer 150 may be formed to cover the first passivation layer 130 and the redistribution layer 140. The second passivation layer 150 may be partially removed to form a second trench T2. A mask pattern 155 may be formed on the second passivation layer 150 to have an open region OP partially corresponding to the redistribution layer 140, and the second passivation layer 150 may be etched through the open region OP to form the second trench T2. A top surface of the redistribution layer 140 may be partially exposed through the second trench T2.

Referring to FIG. 20, the mask pattern 155 may be removed, and a first photoresist pattern 157 may be formed on the second passivation layer 150. The first photoresist pattern 157 may be formed to have a first contact hole CH1 having a greater width than the second trench T2 in a region corresponding to the second trench T2. The top surface of the redistribution layer 140 may be exposed through the first contact hole CH1 and the second trench T2. A top surface of the second passivation layer 150 may be partially exposed through the first contact hole CH1.

A UBM layer 160 may be formed inside the first contact hole CH1 and the second trench T2. For example, the UBM layer 160 may be formed using an electroless plating method or an electroplating method. When the electroless plating method or the electroplating method is used, a seed layer (not shown) may be further formed between the redistribution layer 140 and the UBM layer 160. However, a method of forming the UBM layer 160 according to the inventive concepts is not limited thereto, and a metal layer may be formed and patterned using an etching process.

Referring to FIG. 21, the first photoresist pattern 157 may be removed. The first photoresist pattern 157 may be removed using a dry or wet etching process. The first photoresist pattern 157 may be removed to expose both side surfaces of the UBM layer 160 and the top surface of the second passivation layer 150.

Referring to FIGS. 22 and 23, a second photoresist pattern 163 may be formed on the second passivation layer 150. The second photoresist pattern 163 may be disposed on both sides of the UBM layer 160, and a second contact hole CH2 may be formed to expose a top surface and both side surfaces of the UBM layer 160. A distance W1 between one side surface of the UBM layer 160 and one side surface of the second photoresist pattern 163 may range from 1 μm to 50 μm.

A preliminary solder layer 165 may be formed inside the second contact hole CH2 to cover the UBM layer 160. The preliminary solder layer 165 may include a metal material. For example, the preliminary solder layer 165 may include tin-silver (Sn—Ag)-based metal material. Flux may be provided to the preliminary solder layer 165. The preliminary solder layer 165 may completely cover the exposed top surface and both side surfaces of the UBM layer 160. A thickness of the preliminary solder layer 165 may range from 1 μm to 50 μm. That is, a thickness of a portion of the preliminary solder layer 165 may correspond to a distance W1 between one side surface of the UBM layer 160 and one side surface of the second photoresist pattern 163. A thickness of another portion of the preliminary solder layer 165 may be greater than the distance W1. For instance, the preliminary solder layer 165 may be formed using an electroplating method or an electroless plating method. When the electroplating method or the electroless plating method is used, a seed layer (not shown) may be further formed on the second photoresist pattern 163 and the UBM layer 160. In an embodiment, the preliminary solder layer 165 may be solder paste. The solder paste may include solder powder and flux. For example, when the preliminary solder layer 165 is solder paste, the second photoresist pattern 163 may be omitted.

Figure 25:
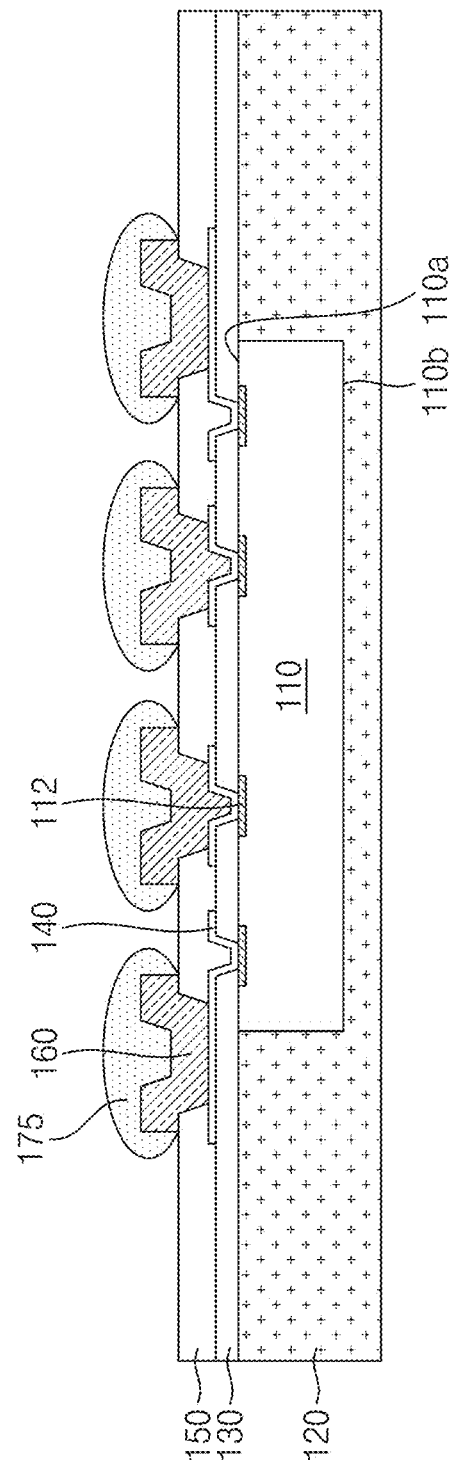

Referring to FIGS. 24 and 25, a solder ball 169 may be provided to the preliminary solder layer 165 to form a solder bump 175. The solder ball 169 may include the same component as the preliminary solder layer 165. For example, the solder ball 169 may include a Sn—Ag-based material. However, the inventive concepts are not limited thereto, and the solder ball 169 may further include other components. The solder bump 175 may be formed on the preliminary solder layer 165 to which flux is provided by means of a ball drop process using a ball-attaching device 180 and 185. The ball-attaching device 180 and 185 by which the solder bump 175 is formed on the UBM layer 160 may include an ejection pin 185 configured to transfer the solder ball 169 and an attaching plate 180 including a plurality of holes having a greater width than the solder ball 169.

The wafer-level package in which the UBM layer 160 and the preliminary solder layer 165 disposed on the UBM layer 160 are formed may be disposed below the attaching plate 180, and the plurality of holes of the attaching plate 180 may be aligned with the preliminary solder layer 165. The solder ball 169 may be picked up by the ejection pin 185 and transferred onto the hole of the attaching plate 180. Thereafter, the ejection pin 185 may release the pick-up of the solder ball 169 and drop the solder ball 169 on the preliminary solder layer 165 that is aligned with the solder ball 169 below the solder ball 169. The preliminary solder layer 165 and the solder ball 169 dropped on the preliminary solder layer 165 may be heated to a melting point or higher and reflowed, thereby forming the solder bump 175. While the preliminary solder layer 165 completely covering the UBM layer 160 is being melted together with the solder ball 169, the solder bump 175 may be formed to completely cover a surface of the UBM layer 160.

Subsequently, the wafer in which the solder bump 175 is formed on the UBM layer 160 may be singulated into individual wafer level packages, thereby completing the manufacture of a plurality of wafer-level packages shown in FIG. 1A.

According to some example embodiments of the inventive concepts, since a thick UBM layer is provided, stress caused when a wafer-level package is mounted on a main board can be reduced to improve board level reliability (BLR).

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A method of manufacturing a wafer-level semiconductor package, the method comprising:
   forming a redistribution layer and a passivation layer on a semiconductor chip;
   etching a trench in an upper surface of the passivation layer;
   forming a photoresist pattern having a first contact hole on the passivation layer such that the first contact hole is formed in a region corresponding to the trench in the upper surface of the passivation layer, and has a width wider than that of the trench in the upper surface of the passivation layer;
   forming an under bump metal (UBM) in the first contact hole and the trench in the upper surface of the passivation layer such that the UBM is on the redistribution layer;
   forming a preliminary solder layer covering the UBM surface; and
   dropping a solder ball on the preliminary solder layer,
   wherein at least one of the UBM and the preliminary solder layer is formed through an electroless plating method, and
   wherein the thickness of the preliminary solder layer is approximately 1-50 μm.

2. The method of claim 1, wherein the preliminary solder layer is a tin-silver (Sn—Ag) based metal layer.

3. The method of claim 1, wherein the preliminary solder layer is a solder paste containing solder powder and flux.

4. The method of claim 1, wherein, before forming the redistribution layer and the passivation layer, further comprising forming a mold layer partially covering the semiconductor chip.

5. The method of claim 4,
   wherein the passivation layer includes a first trench and the trench in the upper surface is a second trench, and
   wherein the forming the redistribution layer and the passivation layer comprising:
   forming a first passivation layer on the semiconductor chip and the mold layer;
   forming the first trench exposing a connection pad of the semiconductor chip in the first passivation layer;
   forming the redistribution layer in the first trench in contact with the connection pad; and
   forming a second passivation layer on the redistribution layer.

6. The method of claim 5, wherein the forming the UBM comprising:
   forming a mask pattern having an open region on the second passivation layer;
   etching the second passivation layer through the open region to form the second trench;
   removing the mask pattern;
   the forming the photoresist pattern having the first contact hole on the second passivation layer; and the forming the UBM in the second trench and the first contact hole.

7. The method of claim 1, wherein forming the preliminary solder layer comprising:
forming a second photoresist pattern having contact holes exposing side surfaces and top surface of the UBM; and
forming the preliminary solder layer inside the contact hole of the second photoresist pattern.

8. The method of claim 7, wherein a distance of one side of the UBM and one side of the second photoresist pattern facing the one side is 1-50 μm.

9. The method of claim 1, wherein the dropping the solder ball comprising:
aligning the preliminary solder layer with a plurality of holes in an attaching plate;
after an ejection pin picks up the solder ball and transfers it onto the hole, the ejection pin releases the pick-up of the solder ball to drop the solder ball on the preliminary solder layer.

10. The method of claim 1, further comprising:
reflowing the preliminary solder layer and the solder ball to form a solder bump.

11. A method of manufacturing a wafer-level semiconductor package, the method comprising:
forming a redistribution layer and a passivation layer on a semiconductor chip;
etching a trench in an upper surface of the passivation layer;
forming a photoresist pattern having a first contact hole on the passivation layer such that the first contact hole is formed in a region corresponding to the trench in the upper surface of the passivation layer, and has a width wider than that of the trench in the upper surface of the passivation layer;
forming an under bump metal (UBM) in the first contact hole and the trench in the upper surface of the passivation layer such that the UBM is on the redistribution layer;
forming a preliminary solder layer covering the UBM surface; and
dropping a solder ball on the preliminary solder layer,
wherein the UBM and the preliminary solder layer are formed through an electroless plating method.

12. The method of claim 11, wherein the preliminary solder layer is a tin-silver (Sn—Ag) based metal layer.

13. The method of claim 11, wherein the preliminary solder layer is a solder paste containing solder powder and flux.

14. The method of claim 11, wherein, before forming the redistribution layer and the passivation layer, further comprising forming a mold layer partially covering the semiconductor chip.

15. The method of claim 14, wherein the forming the redistribution layer and the passivation layer comprising:
forming a first passivation layer on the semiconductor chip and the mold layer;
forming a first trench exposing a connection pad of the semiconductor chip in the first passivation layer;
forming the redistribution layer in the first trench in contact with the connection pad; and
forming a second passivation layer on the redistribution layer.

16. A method of manufacturing a wafer-level semiconductor package, the method comprising:
forming a redistribution layer on a semiconductor chip;
forming an under bump metal (UBM) layer on the redistribution layer;
forming a preliminary solder layer to cover a surface of the UBM layer;
providing flux to a top surface of the preliminary solder layer;
dropping a solder ball on the preliminary solder layer and the flux; and
reflowing the preliminary solder layer, the flux, and the solder ball and forming a solder bump,
wherein the forming of the preliminary solder layer comprises
forming a photoresist pattern having a contact hole configured to expose the UBM layer, and
forming the preliminary solder layer inside the contact hole.

17. The method of claim 16, wherein the preliminary solder layer is a tin-silver (Sn—Ag) based metal layer.

18. The method of claim 16, wherein the forming of the preliminary solder layer comprises electroplating a tin-silver (Sn—Ag) based metal material on the UBM layer.

19. The method of claim 16, wherein a distance between one side surface of the UBM layer and one side surface of the photoresist pattern ranges from 1 μm to 50 μm.

* * * * *